(12) United States Patent
Hashizume

(10) Patent No.: US 11,670,529 B2
(45) Date of Patent: Jun. 6, 2023

(54) SUBSTRATE PROCESSING DEVICE AND COMPONENT INSPECTION METHOD FOR SUBSTRATE PROCESSING DEVICE

(71) Applicant: SCREEN Holdings Co., Ltd., Kyoto (JP)

(72) Inventor: Akio Hashizume, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 443 days.

(21) Appl. No.: 16/634,190

(22) PCT Filed: May 15, 2018

(86) PCT No.: PCT/JP2018/018812
§ 371 (c)(1),
(2) Date: Jan. 27, 2020

(87) PCT Pub. No.: WO2019/021584
PCT Pub. Date: Jan. 31, 2019

(65) Prior Publication Data
US 2020/0234985 A1  Jul. 23, 2020

(30) Foreign Application Priority Data

Jul. 28, 2017 (JP) .............................. JP2017-146459

(51) Int. Cl.
*H01L 21/67* (2006.01)
*H01L 21/66* (2006.01)

(52) U.S. Cl.
CPC .. *H01L 21/67288* (2013.01); *H01L 21/67023* (2013.01); *H01L 22/26* (2013.01)

(58) Field of Classification Search
CPC ......... H01L 21/67288; H01L 21/67023; H01L 22/26
See application file for complete search history.

(56) References Cited

U.S. PATENT DOCUMENTS

| 6,539,959 | B1 | 4/2003 | Ohroku et al. ............... 134/153 |
| 6,663,791 | B1 | 12/2003 | Kawaguchi ..................... 216/61 |
| 2006/0254927 | A1 | 11/2006 | Chiou et al. .................. 205/645 |
| 2007/0161130 | A1 | 7/2007 | Maruyama et al. ............ 438/14 |
| 2008/0289652 | A1 | 11/2008 | Hamada ............................ 134/6 |
| 2010/0212702 | A1 | 8/2010 | Hamada .................... 134/115 R |
| 2011/0038528 | A1 | 2/2011 | Maruyama et al. .......... 382/145 |
| 2017/0287705 | A1 | 10/2017 | Saio et al. |

FOREIGN PATENT DOCUMENTS

| CN | 103477720 A | 12/2013 |
| JP | H06-109545 A | 4/1994 |
| JP | H08-316182 A | 11/1996 |
| JP | H10-217109 A | 8/1998 |
| JP | 2000-228383 A | 8/2000 |
| JP | 2001-053018 A | 2/2001 |
| JP | 2002-096012 A | 4/2002 |
| JP | 2003-092343 A | 3/2003 |
| JP | 2005-233826 A | 9/2005 |
| JP | 2008-541413 A | 11/2008 |
| JP | 2010-074191 A | 4/2010 |
| JP | 2011-138035 A | 7/2011 |
| JP | 4912138 B2 | 4/2012 |
| JP | 2016-066785 A | 4/2016 |
| JP | 6034529 B1 | 11/2016 |

OTHER PUBLICATIONS

International Search Report dated Aug. 7, 2018 in corresponding PCT International Application No. PCT/JP2018/018812.
Written Opinion dated Aug. 7, 2018 in corresponding PCT International Application No. PCT/JP2018/018812.

*Primary Examiner* — Victor A Mandala
*Assistant Examiner* — Colleen E Snow
(74) *Attorney, Agent, or Firm* — Ostrolenk Faber LLP

(57) ABSTRACT

A substrate processing device according to the present invention is a substrate processing device that performs substrate processing with a processing solution and includes inspection means for inspecting degradation of components constituting the substrate processing device. The inspection means includes: capturing means for acquiring image data of the components; color information acquisition means for acquiring color information of an inspection target component from the image data acquired by the capturing means; and degradation determination means for determining a degradation degree of the inspection target component based on the acquired color information.

14 Claims, 12 Drawing Sheets

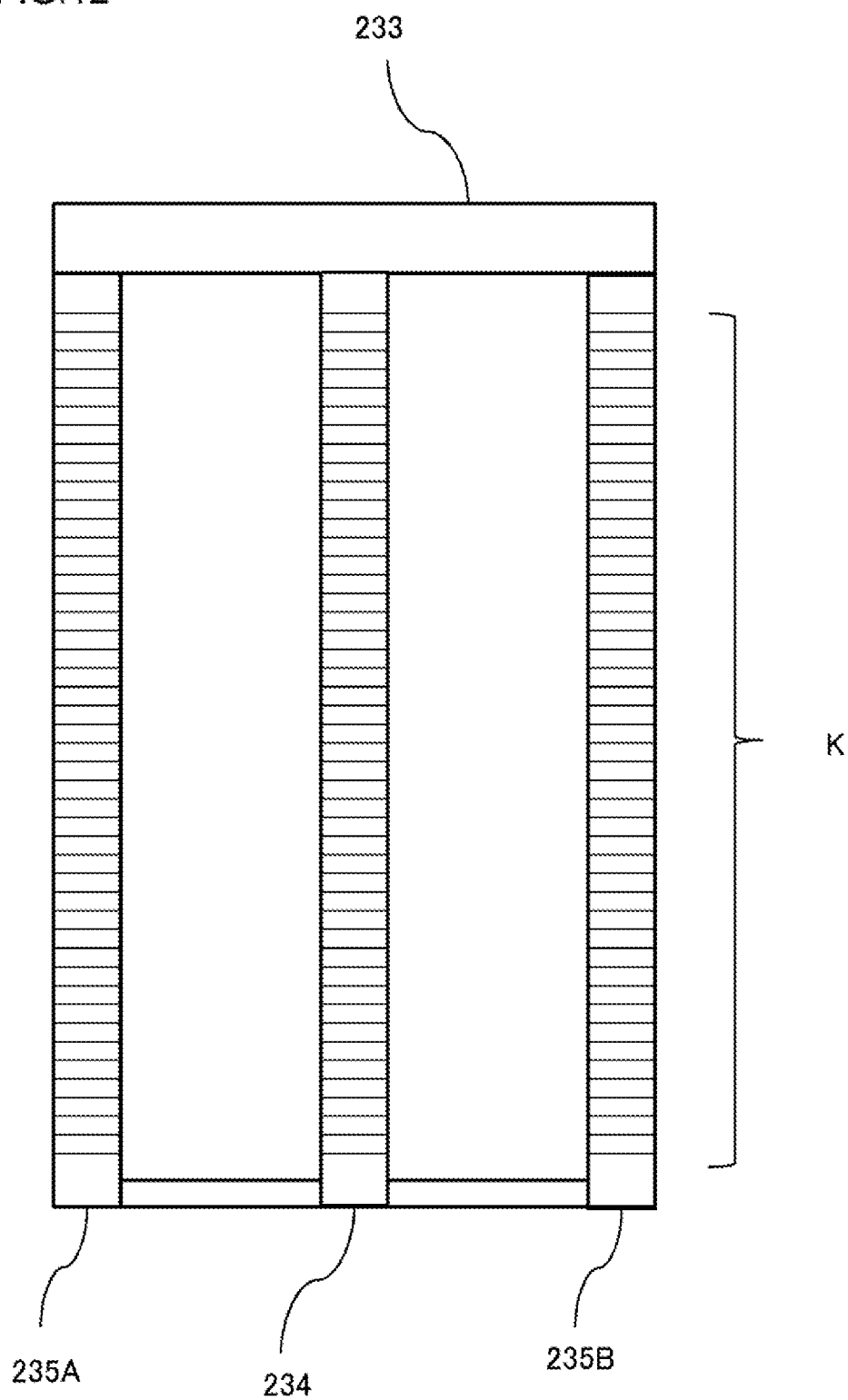

SUBSTRATE PROCESSING DEVICE AND COMPONENT INSPECTION METHOD FOR SUBSTRATE PROCESSING DEVICE

CROSS-REFERENCE TO RELATED APPLICATIONS

The present application is a 35 U.S.C. §§ 371 national phase conversion of PCT/JP2018/018812, filed May 15, 2018, which claims priority to Japanese Patent Application No. 2017-146459, filed Jul. 28, 2017, the specification, drawings and abstract of both applications are incorporated herein by reference in their entirety. The PCT International Application was published in the Japanese language.

TECHNICAL FIELD

The present invention relates to a substrate processing device for processing a substrate. More specifically, the present invention relates to a substrate processing device provided with component inspection means and a method for inspecting a component of the substrate processing device. Incidentally, examples of the substrate referred to in the present specification include a semiconductor wafer, a liquid crystal display substrate, a plasma display substrate, an organic EL substrate, an optical disk substrate, a magnetic disk substrate, a magneto-optical disk substrate, a photomask substrate, a ceramic substrate, a solar cell substrate, and the like.

BACKGROUND ART

Conventionally, as this type of device, there is known a so-called batch type device in which a processing solution is stored in a processing tank, and a substrate is immersed in the processing tank using a lifter that holds the substrate to clean the substrate. Further, there is widely known a so-called single-wafer type device in which a substrate is held horizontally and rotated, and a processing solution is discharged from a nozzle onto a surface of the rotating substrate (for example, Patent Literature 1 and Patent Literature 2).

Components of these devices are subjected to resin coating such as PTFE (polytetrafluoroethylene) and PFA (tetrafluoroethylene/perfluoroalkyl vinyl ether copolymer) for the purpose of prevention of corrosion caused by a chemical solution used for substrate processing. For example, in the case of the batch type device, the lifter to be immersed in the chemical solution is obtained by providing a metal base on a component body made of quartz and then applying the above resin coating to prevent degradation of the component body caused by the chemical solution. Further, even in single-wafer type device, there is a case where a metal component is subjected to the above resin coating for the purpose of prevention of metal contamination of the substrate caused by the metal component (for example, a titanium disk in a scrubber device), prevention of particle generation, and the like.

When the above resin coating is used for a long time, abnormalities such as pinholes occur, which leads to problems such as generation of particles due to resin peeling and generation of metal contamination due to elution of the metal in the base portion of the resin coating. In particular, in the lifter of the batch type device, when the coating of a comb-teeth portion holding the substrate is peeled off so that a width of a groove increases, it becomes difficult to hold the substrates correctly, which causes contact between the substrates held adjacently to each other.

Further, in the single-wafer type device, there is a case where a conductive material containing carbon, such as PFA-CF (a carbon fiber-containing tetrafluoroethylene/perfluoroalkyl vinyl ether copolymer) and ETFE (a tetrafluoroethylene/ethylene copolymer), is used for components, such as a spin base on which the substrate is placed and a chuck pin which fixes the substrate, in order to suppress an adverse effect onto the substrate caused by charging inside the device. Since there is a case where the substrate itself is charged at a previous step of the substrate cleaning process or the inside of the device is charged along with the rotation of the substrate during processing, the conductive material as described above is used and then grounded to remove an electric charge to the outside of the device.

The component made of the conductive material containing carbon as described above gradually loses the carbon to be degraded due to the chemical solution used for processing of the substrate. As a result, there arise problems such as a decrease in strength of the component and generation of particles (fine debris), and thus, it is necessary to replace the component at an appropriate timing.

For this reason, conventionally, an inspection operation using an actual substrate is regularly performed, and the degradation degree of a component is measured by measuring the amount of particles generated by the inspection operation, the metal concentration, and the like, and a measure such as component replacement is taken when an abnormality is found.

With such a method, however, it is difficult to timely detect a component abnormality. Further, there arises a problem that a device needs to be operated only for the inspection (a device operation ratio decreases). Furthermore, there is also a problem that the substrate processing is performed in an abnormal state until the abnormality is detected by the inspection from actual occurrence of an abnormality in the device component. Further, it is difficult to measure the degradation degree in units of individual components, and thus, there is a problem that collective replacement is required even if components, which have not been degraded and remain in good conditions, actually exist (increase in costs).

CITATION LIST

Patent Literature

Patent Literature 1: JP 2002-96012 A
Patent Literature 2: JP 2003-92343 A

SUMMARY OF INVENTION

Technical Problem

In view of the above problems, an object of the present invention is to provide inspection means capable of improving a device operation ratio in a substrate processing device using a processing solution. Further, another object of the present invention is to provide means capable of promptly detecting occurrence of degradation of a component of the device and responding to the degradation.

Solution to Problem

In order to achieve the above object, the present invention adopts the following configuration.

A substrate processing device according to the present invention is a substrate processing device that performs substrate processing with a processing solution and includes inspection means for inspecting degradation of components constituting the substrate processing device. The inspection means includes: capturing means for acquiring image data of the components; color information acquisition means for acquiring color information of an inspection target component from the image data acquired by the capturing means; and degradation determination means for determining a degradation degree of the inspection target component based on the acquired color information.

With the above configuration, it is possible to determine the degradation of the inspection target component based on the color information in the image data of the component, and thus, there is no need to operate the device for a component inspection, and a device operation ratio can be increased. Further, an index used for the inspection is the color information obtained from the image data, and thus, it is possible to set a determination standard more easily than the case of determining a shape of the inspection target.

Further, the component may be made of a conductive material, and the conductive material may contain at least any of a tetrafluoroethylene/ethylene copolymer, a carbon fiber-containing tetrafluoroethylene/perfluoroalkyl vinyl ether copolymer, carbon nanotube-containing polychlorotrifluoroethylene, and carbon nanotube-containing polytetrafluoroethylene.

The component using the conductive material containing carbon loses the carbon due to influence of a chemical solution used for the substrate processing and whitens along with degradation. That is, there is a strong correlation between the degradation of the component and an exterior color, and a difference in the exterior color between a component that has not been degraded and the component that has been degraded is remarkable, and thus, it is suitable to perform the inspection based on the color information in the image data of the component.

A coating layer may be in contact with the processing solution during substrate processing.

There is a case where the component of the substrate processing device is subjected to resin coating for the purpose of prevention of erosion caused by the chemical solution and prevention of metal elution from the component. In this case, the coating is gradually degraded by the chemical solution so that blisters are generated as a surface of a resin coating layer floats up in some places or the resin coating is peeled off to expose metal used for a base of the coating. That is, it is possible to grasp the degradation of the component coated with the resin as a remarkable exterior phenomenon, which is suitable to perform the inspection based on the color information of the image data.

Further, the color information acquired by the color information acquisition means may include RGB component values. Here, the RGB component values are interpreted in a broad sense, and examples thereof include sRGB, AdobeRGB, DCI-P3, and the like.

When a color of the inspection target is identified based on an RGB color space as described above, it is possible to perform determination based on image information reflecting a color difference that is almost equivalent to human perception, and thus, it is possible to perform the component inspection with higher accuracy than image information binarized in black and white, for example. Incidentally, the RGB component values can be easily converted into other color spaces by a known method.

Further, the degradation determination means may determine the degradation degree based on a comparison between the RGB component values and predetermined thresholds. If there is a strong correlation between the degradation of a component and a change in a color of the component, the threshold can be set based on the color of the component in accordance with an arbitrary degradation degree, and it is possible to perform a prompt inspection by performing the degradation determination using the threshold.

Further, the threshold may be defined for each inspection target component and/or for each use of the device. The degree of progress of component degradation and the correlation between degradation and the exterior of a component differ depending on a type of a component, a place where a component is placed, a material of a component, a use of the device (a chemical solution to be used), and the like, and thus, it is possible to perform a more accurate inspection by setting the threshold for each condition.

Further, the substrate processing device further includes output means for outputting the degradation degree determined by the degradation determination means, and the output means may output a warning signal when the degradation degree determined by the degradation determination means exceeds a predetermined standard. According to such a configuration, it is possible to prevent continuous use of a degraded abnormal component.

Further, the inspection target component may include any of a spin base, a chuck pin, a spin chuck, a lifter, and a nozzle. Since these components are rapidly degraded by being exposed to the chemical solution during substrate processing, a more remarkable effect can be obtained by applying the present invention capable of steady observation to these components.

Further, the processing solution may contain any of sulfuric acid hydrogen peroxide, ozone hydrogen peroxide, hydrofluoric acid hydrogen peroxide, ammonia hydrogen peroxide, hydrochloric acid hydrogen peroxide, hydrofluoric acid ozone hydrogen peroxide, HF (hydrofluoric acid), and $H_3PO_4$ (phosphoric acid). These chemical solutions are generally used as the processing solution for substrate processing, and strongly erode a component, and thus, are suitable as inspection targets according to the present invention capable of steady observation.

Further, the capturing means may be arranged inside the device. When the capturing means is arranged inside the device, it is possible to capture an image of a target component more accurately, and as a result, it is possible to obtain a good image and to implement a highly accurate inspection.

Further, the capturing means may be arranged in a nozzle that discharges the processing solution. For example, when such a configuration is applied to a single-wafer type processing device, an image of a spin chuck and a spin base, which are components to be eroded the most by a chemical solution, can be captured from a short distance, and as a result, it is possible to obtain a good image and to implement a highly accurate inspection.

Further, a component inspection method for a substrate processing device according to the present invention is a component inspection method for inspecting a component of a substrate processing device that performs substrate processing with a processing solution, and includes: a capturing step of capturing an image of an inspection target component; a color information acquisition step of acquiring color information of the inspection target component from image data captured in the capturing step; and a degradation determination step of determining a degradation degree of the inspection target component based on color information acquired in the color information acquisition step.

Further, the component in the component inspection method may be made of a conductive material, and the component may contain one made of any material of a tetrafluoroethylene/ethylene copolymer, a carbon fiber-containing tetrafluoroethylene/perfluoroalkyl vinyl ether copolymer, carbon nanotube-containing polychlorotrifluoroethylene, and carbon nanotube-containing polytetrafluoroethylene.

Further, the color information acquired in the color information acquisition step may include RGB component values. Further, in the degradation determination step, the degradation degree may be determined based on comparison between the RGB component values and predetermined thresholds. Further, the threshold may be determined for each inspection target component and/or for each use of the device.

Further, the component inspection method may further include a warning step of outputting a warning signal when the degradation degree determined in the degradation determination step exceeds a predetermined standard.

Further, the inspection target component in the component inspection method may include any of a spin base, a chuck pin, a spin chuck, a nozzle, and a lifter.

Further, the processing solution in the component inspection method may contain any of sulfuric acid hydrogen peroxide, ozone hydrogen peroxide, hydrofluoric acid hydrogen peroxide, ammonia hydrogen peroxide, hydrochloric acid hydrogen peroxide, hydrofluoric acid ozone hydrogen peroxide, HF (hydrofluoric acid), and $H_3PO_4$ (phosphoric acid).

Advantageous Effects of Invention

According to the present invention, it is possible to provide the inspection means capable of improving the device operation ratio in the substrate processing device using the processing solution. Further, it is possible to provide inspection means capable of reducing repair cost according to the present invention.

BRIEF DESCRIPTION OF DRAWINGS

FIG. 12 is a partial plan view of the substrate processing device according to the second embodiment.

DESCRIPTION OF EMBODIMENTS

Hereinafter, modes for carrying out the present invention will be exemplarily described in detail based on embodiments with reference to the drawings. However, dimensions, materials, shapes, and relative arrangements of components disclosed in the embodiments are not intended to limit the scope of the present invention thereto unless otherwise specified.

First Embodiment

Figure 1:
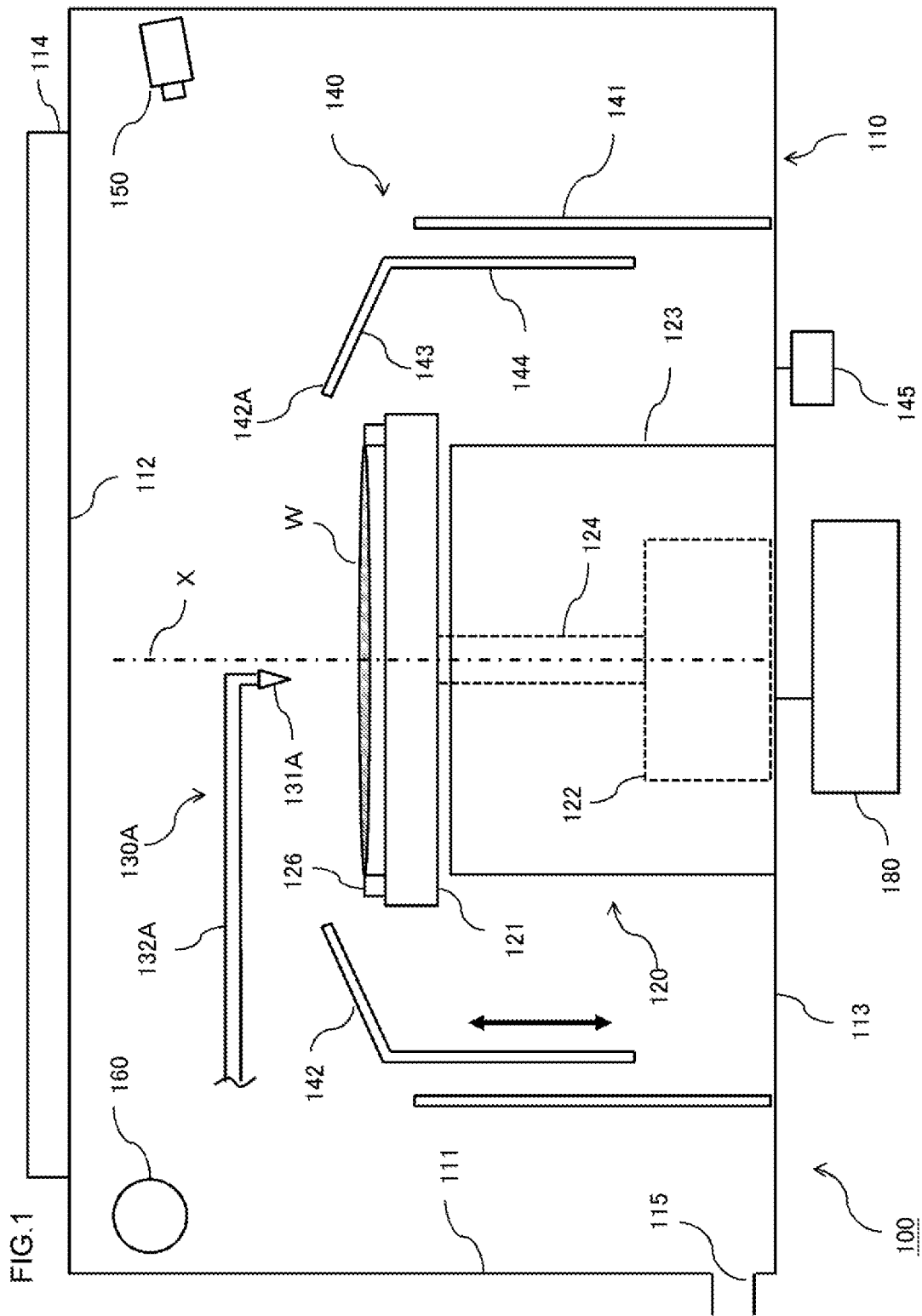
FIG. 1 is a schematic view illustrating a configuration of a substrate processing device according to a first embodiment.
Figure 2:
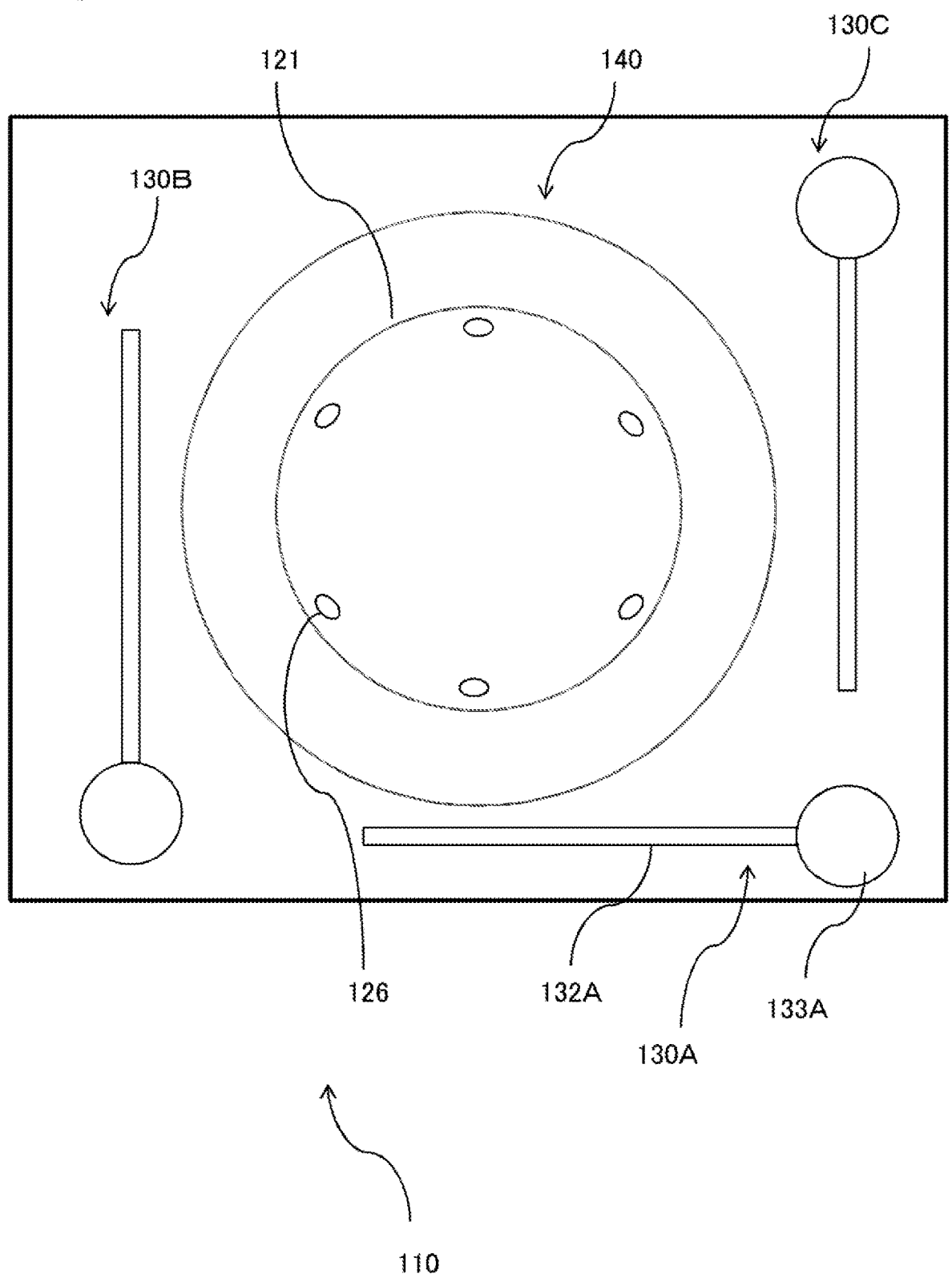
FIG. 2 is a schematic plan view illustrating the configuration of the substrate processing device according to the first embodiment.

FIG. 1 is a schematic cross-sectional view illustrating a configuration of a substrate processing device 100 according to the present embodiment, and FIG. 2 is a schematic plan view illustrating the configuration of the substrate processing device 100. Incidentally, FIG. 1 illustrates a state where a substrate W is held by a spin chuck 120 to be described later, and FIG. 2 illustrates a state where the substrate W is not held by the spin chuck 120 to be described later.

The substrate processing device 100 is a so-called single-wafer type processing device that processes substrates W for semiconductor applications one by one, and rotates a circular silicon substrate at a high speed, performs a cleaning process using a chemical solution and pure water, and then, performs a drying process. As the chemical solution, for example, SPM (a mixed solution of sulfuric acid and hydrogen peroxide solution), ozone hydrogen peroxide solution (a mixed solution of ozone and hydrogen peroxide solution), SC1 (a mixed solution of an ammonia solution and hydrogen peroxide solution), SC2 (a mixed solution of hydrochloric acid and hydrogen peroxide solution), FPM (a mixed solution of hydrofluoric acid and hydrogen peroxide solution), FOM (a mixed solution of hydrofluoric acid and ozone hydrogen peroxide solution), or the like is used. Incidentally, the term "processing solution" is used as a meaning that includes a chemical solution and pure water in the present specification. Further, the "processing solution" also includes a coating solution such as a photoresist solution for deposition, a chemical solution for removal of an unnecessary film, a chemical solution for etching, and the like.

As illustrated in FIGS. 1 and 2, the substrate processing device 100 includes: a spin chuck 120 that horizontally holds the substrate W, as a main element, in a box-shaped chamber 110; three upper surface processing solution nozzles 130A, 130B, and 130C configured to supply the processing solution to an upper surface of the substrate W held by the spin chuck 120; a cup 140 surrounding the periphery of the spin chuck 120; a camera 150 that images the spin chuck 120 and an upper side of the spin chuck 120; and an illumination device 160. In addition, a control device 180 and a transfer robot (not illustrated) that carries the substrate W into and out of the chamber 110 are provided.

Among the above configurations, at least the spin chuck 120 and the upper surface processing solution nozzle 130 are made of a conductive material containing carbon and are grounded so as to be capable of removing an electric charge inside the device. Incidentally, examples of the conductive material include ETFE (a tetrafluoroethylene/ethylene copolymer), PFA-CF (a carbon fiber-containing tetrafluoroethylene/perfluoroalkyl vinyl ether copolymer), PCTFE-CNT (carbon nanotube-containing polychlorotrifluoroethylene), PTFE-CNT (carbon nanotube-containing polytetrafluoroethylene), and the like.

The chamber 110 includes a sidewall 111 that surrounds the outer periphery along the vertical direction, a ceiling 112 that closes the upper side of a space surrounded by the sidewall 111, and a floor 113 that closes the lower side. The space surrounded by the sidewall 111, the ceiling 112, and the floor 113 is a processing space for the substrate W. Further, a part of the sidewall 111 of the chamber 110 is provided with an inlet/outlet configured for the transfer robot to carry the substrate W into and out of the chamber 110 and a shutter that opens and closes the inlet/outlet (not illustrated).

A fan filter unit 114, configured to clean air and supply the cleaned air to the processing space inside the chamber 110, is provided on the ceiling 112 of the chamber 110. The fan filter unit 114 includes a fan and a filter configured to take in air inside a clean room where the substrate processing device 100 is installed and send the air into the chamber 110, and downflow of the cleaned air is formed in the processing space inside the chamber 110. Then, the air sent by the fan filter unit 114 is discharged out of the device in the lower part of the chamber 110, for example, from an exhaust duct 115 which is a part of the sidewall 111 provided in the vicinity of the floor 113.

The spin chuck 120 includes a disk-shaped spin base 121, which is fixed to an upper end of a rotating shaft 124 extending along the vertical direction, and a spin motor 122 that rotates the rotating shaft 124 is provided below the spin base 121. The spin motor 122 rotates the spin base 121 on a horizontal plane via the rotating shaft 124. Incidentally, the spin motor 122 is driven by the control device 180. Further, a cover member 123 is provided so as to surround the periphery of the spin motor 122 and the rotating shaft 124. The cover member 123 has an upper end positioned immediately below the spin base 121 and a lower end fixed to the floor 113 of the chamber 110.

An upper surface of the spin base 121 opposes the entire lower surface of the substrate W that needs to be held, and an outer diameter of the spin base 121 is slightly larger than a diameter of the circular substrate W held by the spin chuck 120. Then, a plurality of (six in the present embodiment) chuck pins 126 are provided on a peripheral edge of the upper surface of the spin base 121 so as to protrude upward. The plurality of chuck pins 126 are arranged at equal intervals along a circumference corresponding to an outer circumference of the circular substrate W (at an interval of 60° in the present embodiment).

The spin chuck 120 grips the substrate W by bringing each of the plurality of chuck pins 126 into contact with an outer peripheral end of the substrate W, and thus, can hold the substrate W above the spin base 121 in a horizontal posture close to the upper surface of the spin base 121. Incidentally, the gripping of the substrate W is released by separating each of the plurality of chuck pins 126 from the outer peripheral end of the substrate W.

When the spin motor 122 rotates the rotating shaft 124 in a state where the spin chuck 120 holds the substrate W by the gripping using the plurality of chuck pins 126, the substrate W can be rotated about a rotation axis X which passes through the center of the substrate W and extends along the vertical direction.

The cup 140 surrounding the spin chuck 120 includes: a cylindrical outer wall 141; a splash guard 142 that surrounds the spin chuck 120 inside the outer wall 141; a guard lifting unit (not illustrated) that moves the splash guard 142 up and down in the vertical direction; and a processing solution recovery unit 145. The outer wall 141 is fixed to the floor 113 of the chamber 110, and the splash guard 142 is provided so as to be movable up and down with respect to the outer wall 141 of the cup 140. The processing solution recovery unit 145 is provided at the bottom of the cup 140 and is connected to a processing solution recovery mechanism (not illustrated) outside the cup 140.

The splash guard 142 includes: a tubular inclined portion 143 having a tapered side surface which extends obliquely upward toward the rotation axis X; and a cylindrical guide portion 144 which extends downward from a lower end of the inclined portion 143. An upper end of the inclined portion 143 is formed in an annular shape having a larger inner diameter than the substrate W and the spin base 121, and corresponds to an upper end 142A of the splash guard 142. That is, the upper end 142A of the splash guard 142 is formed in a mode of surrounding the substrate W and the spin base 121 in plan view as illustrated in FIG. 2.

The guard lifting unit moves the splash guard 142 up and down between a lower position where the upper end 142A of the splash guard 142 is positioned below the substrate W and an upper position where the upper end 142A of the splash guard 142 is positioned above the substrate W (in FIG. 1, the splash guard 142 is arranged at the upper position). Incidentally, various known mechanisms, for example, a ball screw mechanism, an air cylinder, and the like can be adopted as such a lifting mechanism, and thus, detailed descriptions thereof will be omitted.

The splash guard 142 is arranged at the upper position during the cleaning process of the substrate W (that is, the rotation of the substrate W) and receives the processing solution scattered from the substrate W to the periphery of the substrate W on an inner peripheral surface thereof. While the substrate W is not being cleaned, the splash guard 142 is in a standby state at the lower position. At this time, the substrate W is delivered between the transfer robot (not illustrated) and the spin chuck 120. Incidentally, the processing solution collected at the bottom of the cup by being received by the splash guard 142 is discharged from the cup 140 via the processing solution recovery unit 145.

The upper surface processing solution nozzle 130A is configured by attaching a discharge head 131A to a distal end of a nozzle arm 132A that also serves as a processing solution supply pipe. A proximal end side of the nozzle arm 132A is connected to a nozzle pedestal 133A, and the nozzle pedestal 133A is configured to be rotatable about an axis along the vertical direction by a motor (not illustrated). As the nozzle pedestal 133 is rotated, the upper surface processing solution nozzle 130A moves in an arc shape along the horizontal direction between a processing solution discharge position above the spin chuck 120 and the standby position outside the cup 140.

It is configured such that the processing solution (for example, SPM) is supplied to the upper surface processing solution nozzle 130, and the processing solution discharged from the discharge head 131 of the upper surface processing solution nozzle 130 at the processing solution discharge position is deposited on the upper surface of the substrate W held by the spin chuck 120. Further, the upper surface processing solution nozzle 130 can be swung above the upper surface of the spin base 121 by the rotation of the nozzle pedestal 33, and the processing solution can be discharged onto the substrate W while being swung.

The other two upper surface processing solution nozzles 130B and 130C also have the same configuration as the upper surface processing solution nozzle 130A, but processing solutions to be supplied are different from each other (for example, SC1 is supplied to the upper surface processing solution nozzle 130B, and pure water is supplied to the upper surface processing solution nozzle 130C). Incidentally, the processing solutions to be supplied to the respective upper surface processing solution nozzles are not necessarily unique, and it may be configured to enable the supply of a plurality of processing solutions. Further, the number of nozzles provided in the substrate processing device 100 is not limited to three, and may be one or more.

Figure 3A:
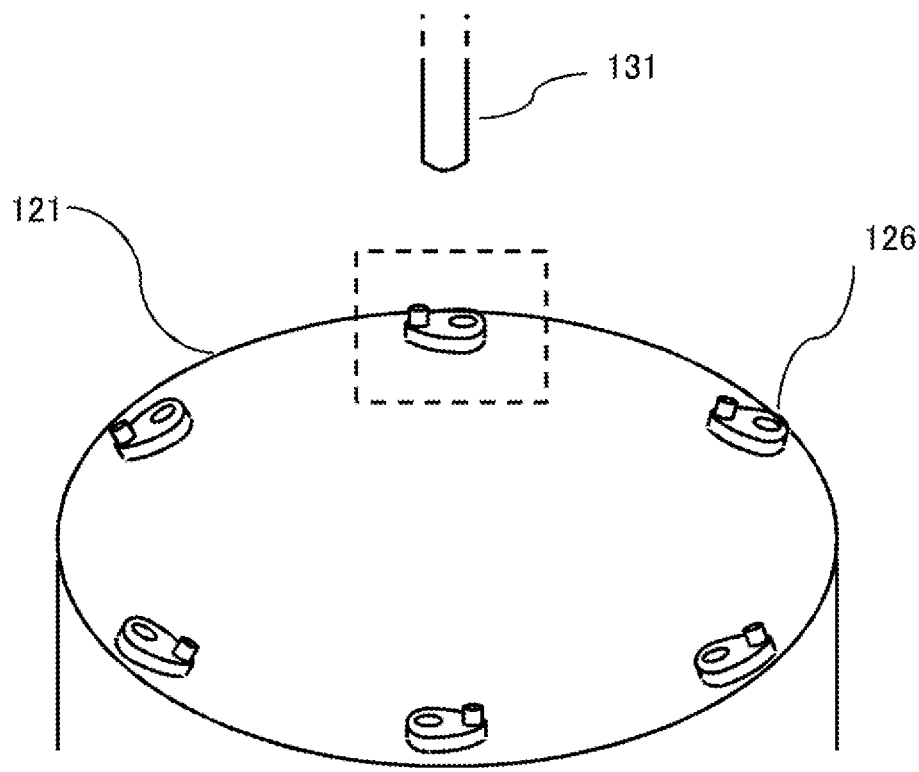
FIG. 3A is a view illustrating an example of an image captured by a camera according to the first embodiment.
Figure 3B:
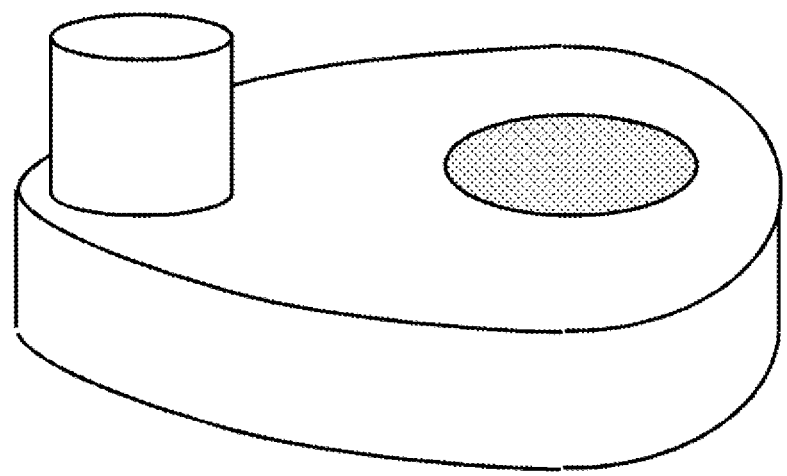
FIG. 3B is a view illustrating a state where a part of the image captured by the camera of the first embodiment is focused.

The camera 150 is arranged above the sidewall 111 of the chamber 110 so as to be capable of capturing the image of the spin chuck 120 (particularly the vicinity of the spin base 121) and its upper space (particularly the vicinity of the processing solution discharge position of the upper surface processing solution nozzle 130). FIG. 3 illustrates an example of an image captured by the camera 150. As illustrated in FIG. 3A, the camera 150 images the spin chuck 120 and its upper space. Incidentally, FIG. 3B illustrates a close-up state where a dotted-line portion (one of the chuck pins) in FIG. 3A. As illustrated in FIG. 3B, a specific component may be focused and an image of the specific component may be captured.

The camera 150 includes light receiving elements, for example, a CCD image sensor and the like, and light is converted into an electric charge according to the amount of received light in each light receiving element. Incidentally, the camera 150 includes three CCD image sensors for each of R, G, and B color components in the present embodiment, and the electric charge output from each light receiving element is input to the control device 180 as an output signal (captured data).

The illumination device 160 is arranged above the sidewall 111 of the chamber 110 so as to be capable of illuminating the inside of the chamber 110 (particularly, the spin chuck 120 and its upper space). Incidentally, a general light source, for example, an LED, a fluorescent lamp, or the like can be used for the illumination device 160, but light to be emitted is desirably white light.

A configuration of the control device 180 as hardware is the same as that of a general computer. That is, an input unit such as a keyboard, an output unit such as a monitor, a central processing unit (CPU), a read only memory (ROM), a random access memory (RAM), a mass storage device, and the like are provided. When the CPU of the control device 180 executes a predetermined processing program, each operation mechanism of the substrate processing device 100 is controlled by the control device 180 to perform processing in the substrate processing device 100.

Figure 4:
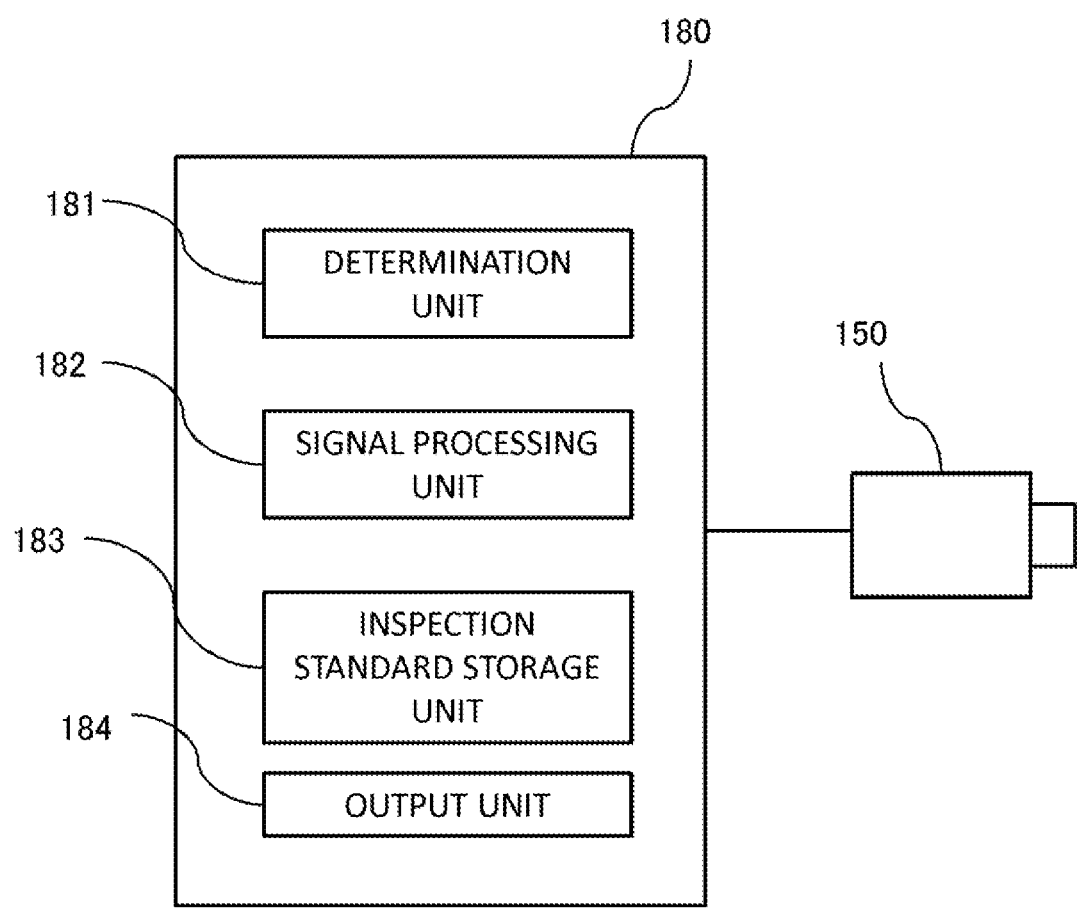
FIG. 4 is a block diagram illustrating functions of a control device according to the first embodiment.

FIG. 4 is a block diagram illustrating functions relating to a component inspection of the control device 180. A determination unit 181 illustrated in FIG. 4 is a function processing unit that is realized in the control device 180 when the CPU of the control device 180 executes the predetermined processing program. The determination unit 181 performs image processing on an image captured by the camera 150 to perform determination processing (that is, a component inspection) on degradation of various components constituting the substrate processing device 100 although details will be described later.

A signal processing unit 182 acquires RGB color component values from an image acquired by the camera 150. Specifically, a signal output from the camera 150 is received, shading correction is performed for each of the R, G, and B color components, and a value obtained by correcting an output level variation for each light receiving element is calculated. Incidentally, a luminance value for each of the R, G, B color components of each pixel after shading correction is used as an input value to be used for determination, and has a value range of, for example, 0 to 255 in the present embodiment.

An inspection standard storage unit 183 is configured using the above RAM or a magnetic disk, and stores a determination threshold data table to be used for determination by the determination unit 181, RGB values of a new component whose image is captured by the camera 150, RGB values of a degraded component sample, and the like. When an image of a component is captured by the camera 150 to acquire RGB values, it is desirable to define a capturing procedure regarding part of the component whose image is to be captured, lighting conditions, and the like.

An output unit 184 outputs various types of information including an inspection result. An output destination of information is typically a display device such as a monitor, but information may be output to a printing device, a message or an alarm may be output from a speaker, a message may be transmitted to user's terminal via e-mail or the like, or information may be transmitted to an external computer.

(Regarding Degradation Determination Processing Method)

Next, a component degradation determination process performed by the above determination unit 181 will be described. As described above, the determination unit 181 performs an inspection based on the image captured by the camera 150 as to whether an inspection target component has been degraded. More specifically, degradation determination is performed based on color information of RGB color components obtained from image data of the target component. Incidentally, components to be inspected in the present embodiment are the chuck pin 126, the spin base 121, the cover member 123, and the upper surface processing solution nozzle 130.

A component made of a conductive material containing carbon, which is similar to the respective components described above, is gradually degraded and loses the carbon due to a chemical solution used for substrate processing. Then, the exterior of the component becomes whiter than a new component along with the loss of carbon. That is, there is a strong correlation between strength of the component and the exterior (color) of the component. A specific example of the correlation between degradation and whitening of the component will be described next.

Figure 5:
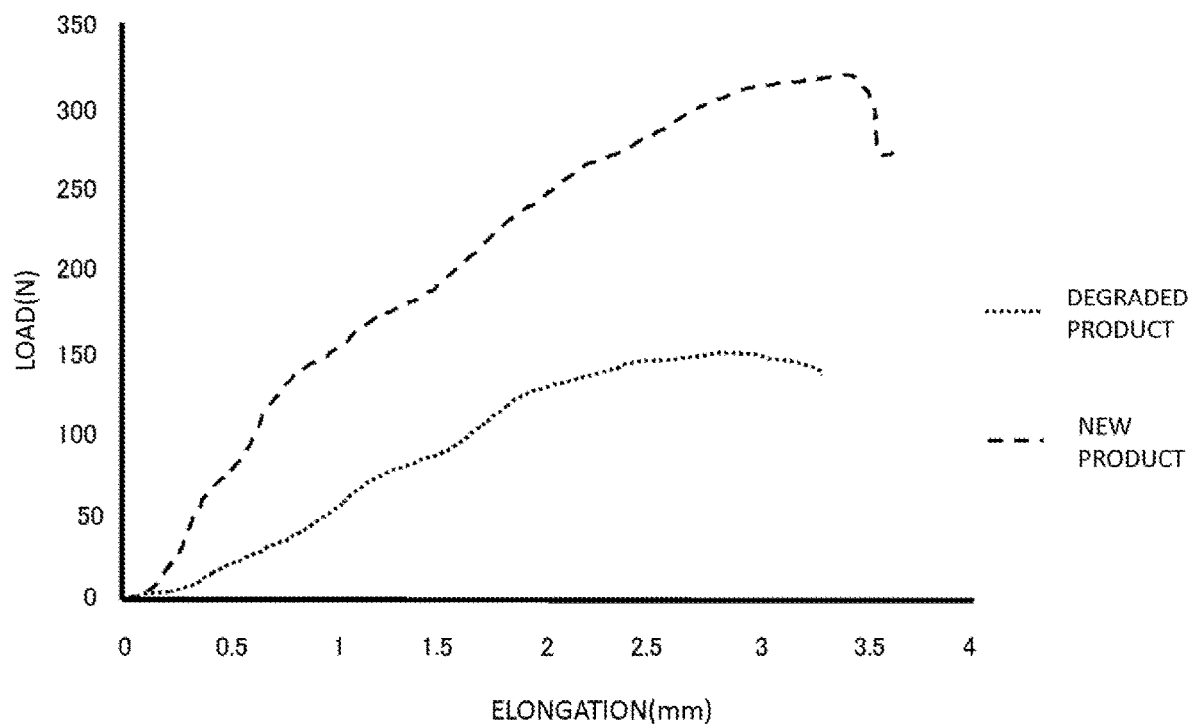
FIG. 5 is a graph comparing strength of a new chuck pin with strength of a whitened chuck pin.

FIG. 5 is a graph comparing tensile strength of a new chuck pin with strength of a whitened chuck pin. The vertical axis represents a load, and the horizontal axis represents the elongation of a component. In the drawing, the solid line represents data of a new component, and the broken line represents data of a whitened component. As apparent from FIG. 5, it can be understood that strength has been degraded by 50% or more in the whitened component as compared to the new component.

For this reason, if whitening on the exterior of a component can be identified, it becomes possible to grasp degradation of the component based on the identified whitening. Then, color information of the exterior such as whitening of a component can be acquired by capturing the image of the component by the camera to obtain image data.

When a color of a component is whitened, generally, an R value, a G value, and a B value of an RGB signal all indicate an increasing tendency. When attention is paid to any one of the R value, the G value, and the B value to determine whether the value exceeds a threshold set in advance through an experiment or the like, it is possible to determine whether component degradation has exceeded an allowable limit. Further, thresholds may be set for the R value, the G value, and the B value, respectively, and all these thresholds may be comprehensively considered to determine whether the component degradation has exceeded the allowable limit.

A method of acquiring color information (RGB values) by capturing an image of a component and determining the magnitude of the value in the above-described way is more excellent than a way of capturing an image of a component and determining only brightness information in that it is possible to cope with various components and that it is possible to comprehensively consider three RGB values. A color of a surface and an optical property of the surface are different depending on a component, and thus, it is possible to detect degradation of a component (particularly a component where whitening occurs) with high sensitivity by setting standard RGB values for each component while a case where it is difficult to detect a degradation degree with high sensitivity only from a change in brightness information is also assumed.

Incidentally, when the above threshold is set to be small, it is also possible to issue a warning while the degree of whitening is relatively low for the purpose of issuing a warning before the component degradation progresses to an unallowable degree. If a warning is issued while the degree of whitening is relatively low, it is possible to prevent continuous use of an abnormal component.

A standard for determination on whether to issue the warning (hereinafter also referred to as a warning issuance standard) is set for each component, an image of a target component is captured by the camera 150 to acquire color information (RGB values) from image data, and a warning can be issued from the output unit 184 if the obtained color information deviates from the standard. Incidentally, the warning issued from the output unit 184 may be an error screen displayed on a monitor, an alarm issued from a speaker, flickering of an alarm lamp, or the like.

Figure 6:
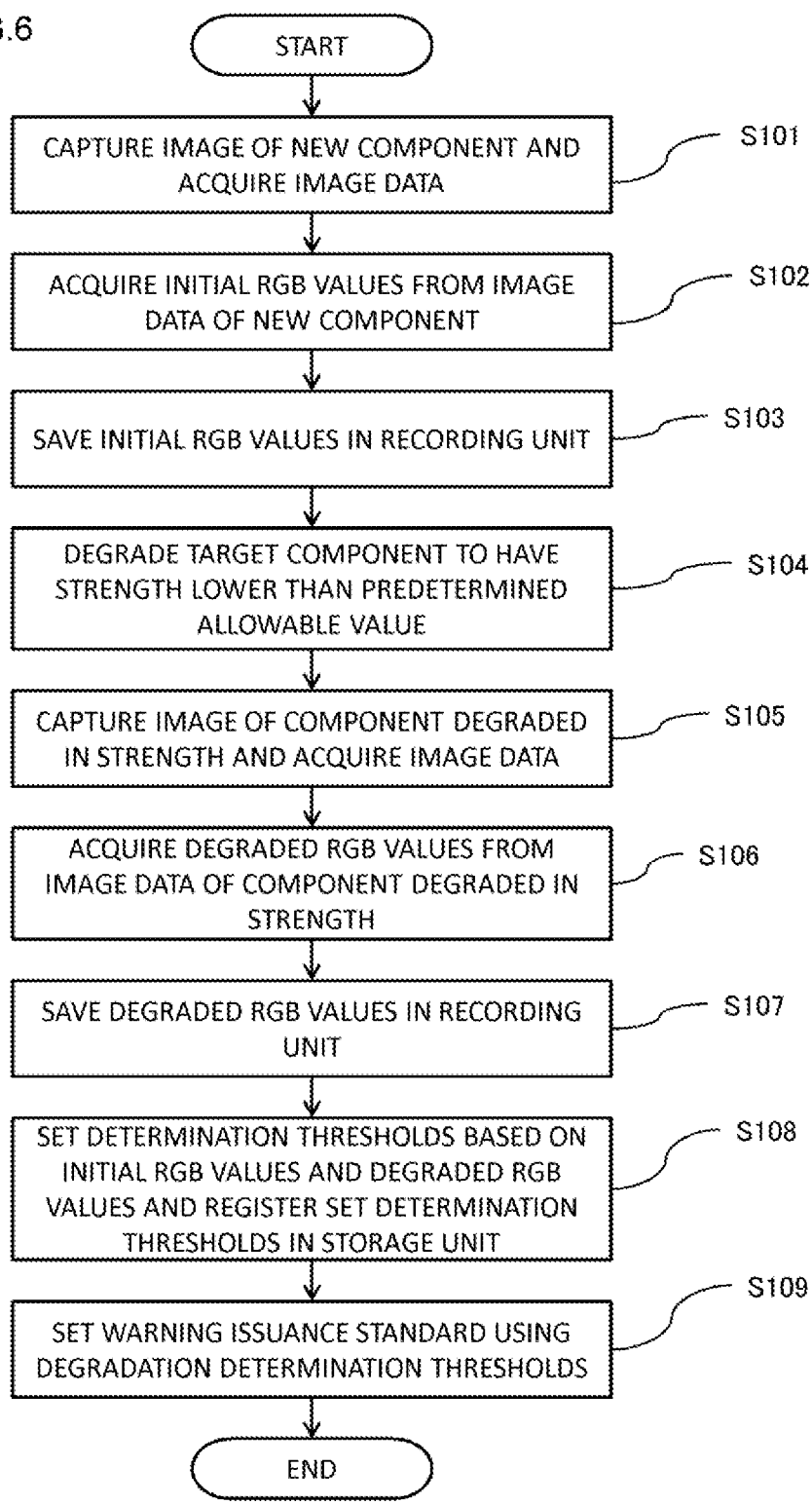
FIG. 6 is a flowchart illustrating flow of processing when an inspection standard according to the first embodiment is set.

FIG. 6 is a flowchart illustrating flow of processing when such a determination standard is set. As illustrated in FIG. 6, when a new device is started up or when a component is replaced with a new component, an image of an inspection target component is captured by the camera 150 (Step S101), and R, G, and B values (initial RGB values) acquired and processed by the signal processing unit 182 are saved in the inspection standard storage unit 183 together with image data (initial image data) of the component (Steps S102 and S103).

Next, the inspection target component is exposed to a chemical solution used in the processing device, and is degraded until the strength (for example, tensile strength) of the component becomes an arbitrary allowable value or less (Step S104). The image of the component whose strength is the allowable value or less in this manner is captured by the camera 150 (Step S105), and R, G, and B values (degraded RGB values) processed by the signal processing unit 182 are saved in the inspection standard storage unit 183 (Steps S106 and S107).

Then, arbitrary values (for example, an R value of 199, a G value of 199, and a B value of 199) between the initial RGB values (for example, an R value of 10, a G value of 10, and a B value of 10) and the degraded RGB values (for example, an R value of 240, a G value of 240, and a B value of 240) are registered, as degradation determination thresholds, in the inspection standard storage unit 183 (Step S108).

Incidentally, whitening of a component does not occur similarly over the entire component, and thus, it is necessary to define a relationship between the degradation determination threshold and a warning issuance standard. That is, it is defined the number of pixels reaching the degradation determination thresholds or more among (a set of) pixels indicating an inspection target component in an image acquired by the camera 150 for which a warning is to be issued. In the present embodiment, the warning issuance standard is set so as to issue a warning when pixels indicating values equal to or more than the degradation determination thresholds exceed a predetermined ratio (for example, 30%) out of a set of pixels indicating an inspection target component (for example, a chuck pin) in an acquired image (Step S109).

Meanwhile, the degradation of a target component is smaller as RGB values of the target component obtained from image data are closer to the initial RGB values, and the degradation of the target component is larger as the RGB values are closer to the degraded RGB values. For this reason, for example, when it is desired to allow a period between generation of an alarm and replacement of a component to leave a margin, the degradation determination thresholds are preferably set to values relatively close to the initial RGB values.

Incidentally, the degree of progress of component degradation, the correlation between whitening and degradation, and the like are different depending on a type of a component, a place where a component is placed, a material of a component, use of the device (a chemical solution to be used), and the like. Therefore, the degradation determination thresholds is preferably set for each combination of the various conditions using a data table. The management using the data table may be similarly applied for the registration of the initial RGB values and the degraded RGB values.

(Inspection Implementation Timing)

Next, an operation of the substrate processing device 100 and the timing to implement component degradation determination (that is, an inspection) will be described. During the normal operation of the substrate processing device 100, an unprocessed substrate W received from the outside by the transfer robot is carried into the chamber 110, the substrate W is subjected to a cleaning process inside the chamber 110, and then, the transfer robot carries the processed substrate W out of the chamber 110 and returns the substrate W to the outside.

Further, an outline of a typical cleaning process procedure for the substrate W in the substrate processing device 100 includes predetermined chemical solution processing performed with supply of a chemical solution onto a surface of the substrate W, pure water rinsing performed thereafter with supply of pure water, and then, draining and drying by rotating the substrate W at a high speed. These processes are performed for each substrate W1.

Incidentally, when the substrate W is processed, the substrate W is held by the spin chuck 120, and the cup 140 moves up and down. When processing with a processing solution is performed, the splash guard 142 is raised to be arranged at the upper position, and an opening surrounding the periphery of the substrate W held by the spin chuck 120 is formed. In this state, the substrate W is rotated together with the spin chuck 120, and the processing solution is supplied from the upper surface processing solution nozzle 130 to an upper surface of the substrate W. The supplied processing solution flows along the upper surface of the substrate W due to a centrifugal force generated by the rotation of the substrate W, and is eventually scattered from an edge of the substrate W to the side. As a result, a cleaning process of the substrate W proceeds. The processing solution scattered from the edge of the rotating substrate W is received by the inclined portion 143 of the splash guard 142, and flows downward along an inner surface of the inclined portion 143 to be collected.

Based on the above description, it is difficult to properly capture the image of the chuck pin 126 and the spin base 121 during the processing of the substrate W among the components to be inspected in the present embodiment. For this reason, the component degradation determination is implemented at timing when the substrate processing device 100 is not performing the cleaning process on the substrate W in the present embodiment.

Figure 7:
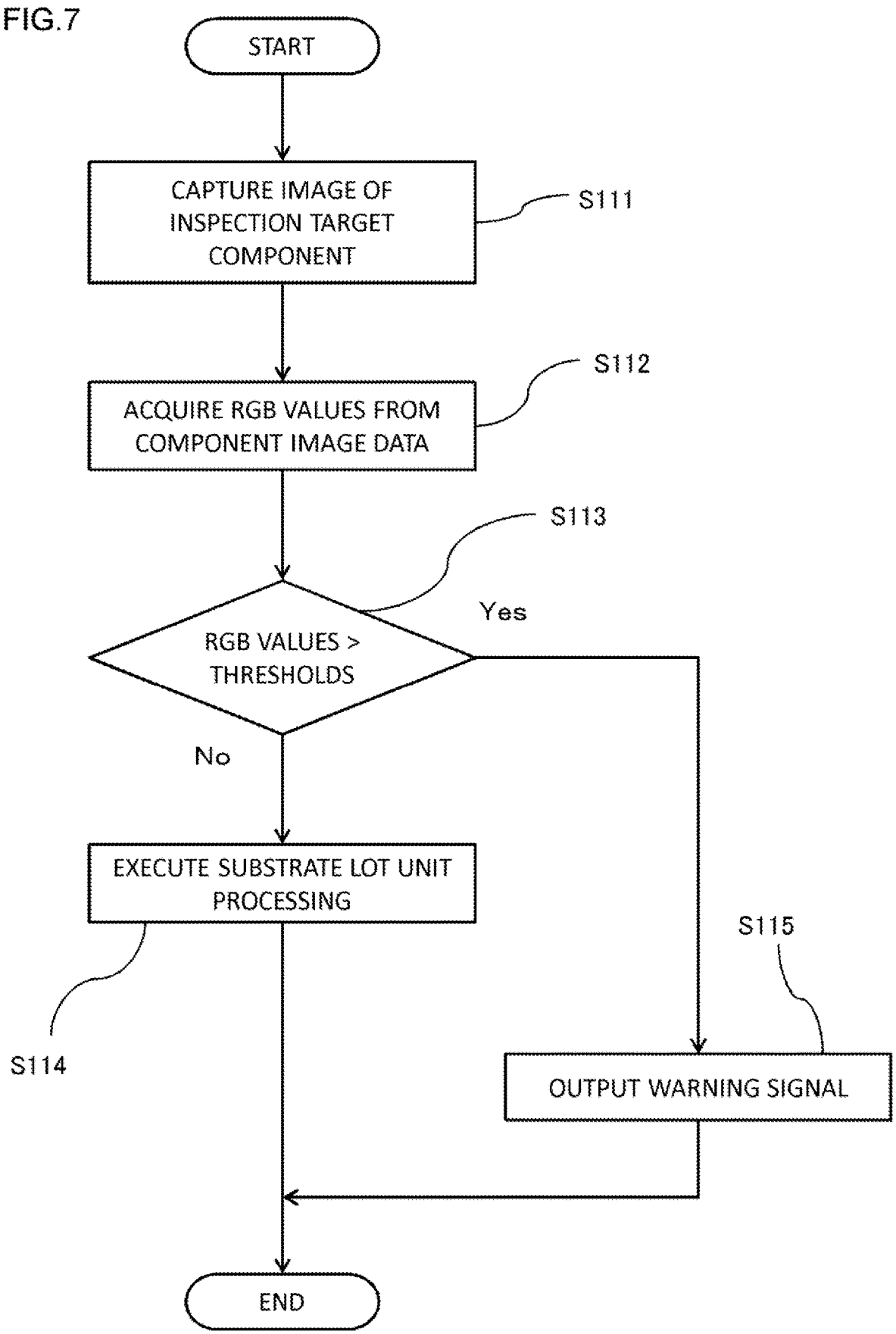
FIG. 7 is a flowchart illustrating an example of timing to implement processing for determining degradation of a component according to the first embodiment.

FIG. 7 is a flowchart illustrating an example of the timing to implement the component degradation determination process. As illustrated in FIG. 7, first, an image of an inspection target component is captured by the camera 150 during an idle time before starting the substrate processing in units of lots in the substrate processing device 100 (Step S111). Then, RGB values of pixels indicating the inspection target component are extracted from captured image data by the signal processing unit 182 (Step S112). Then, the determination unit 181 compares the determination standard stored in the inspection standard storage unit 183 with the extracted RGB values (Step S113), and substrate processing for one lot is implemented when the RGB values do not exceed the determination standard (S114). On the other hand, when the RGB values exceed the determination standard in Step S113, a warning signal to give a notification of degradation of the component is transmitted from the output unit 184 (Step S115).

Figure 8:
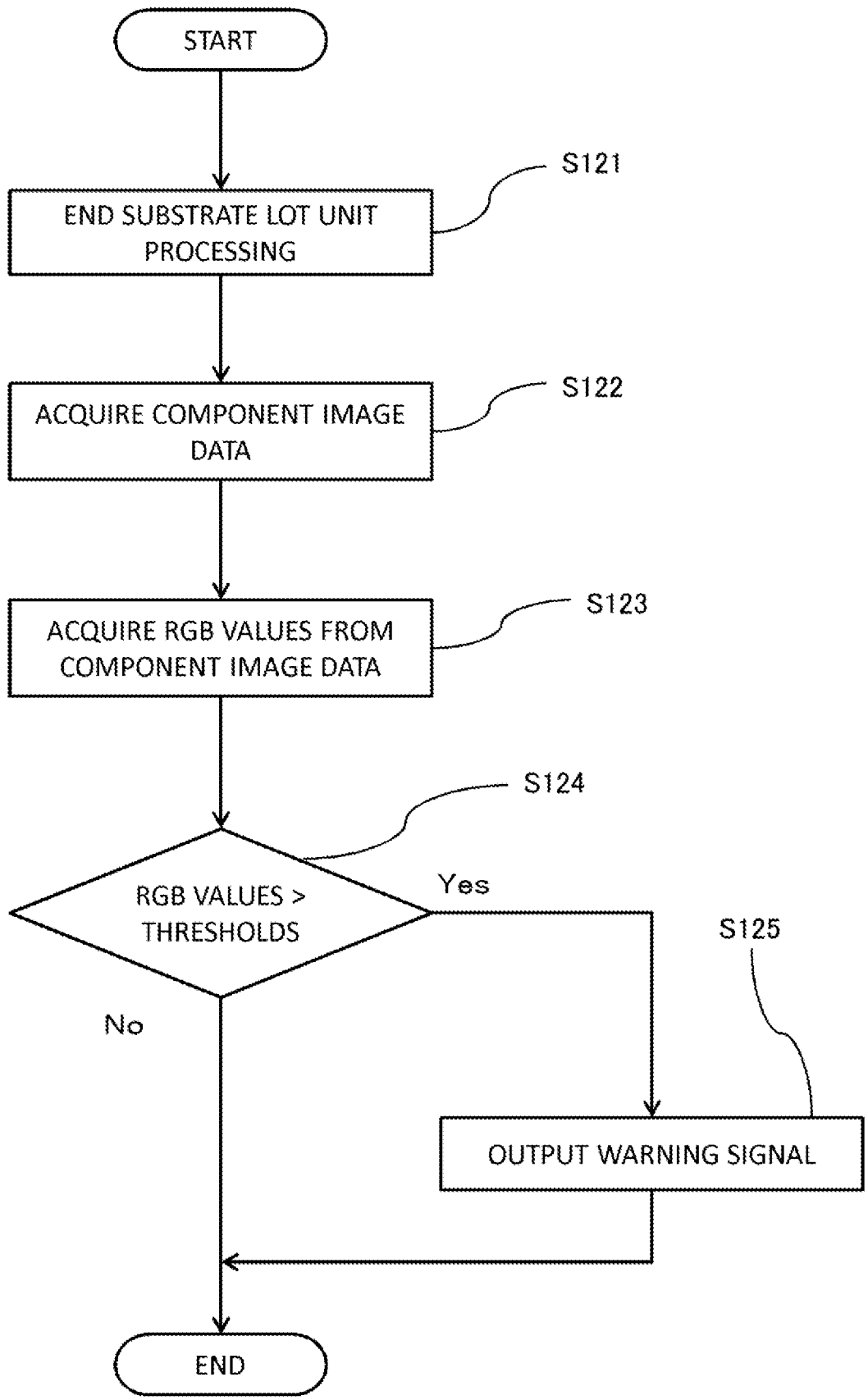
FIG. 8 is a flowchart illustrating an example of timing to implement processing for determining degradation of a component according to the first embodiment.

FIG. 8 is a flowchart illustrating another example of the timing to implement the component degradation determination process. As illustrated in FIG. 8, an image of an inspection target component is captured by the camera 150 after the substrate processing for one lot is completed in the substrate processing device 100 (Steps S121 and S122). Then, RGB values of pixels indicating the inspection target component are extracted from captured image data by the signal processing unit 182 (Step S123). Then, the determination unit 181 compares the determination standard stored in the inspection standard storage unit 183 with the extracted RGB values (Step S124), and this flow ends when the RGB values do not exceed the determination standard. On the other hand, when the RGB values exceed the determination standard in Step S124, a warning signal to give a notification of degradation of the component is transmitted from the output unit 184 (Step S125). When the inspection is performed at such timing, it is also possible to verify whether there is trouble (the degree of occurrence of a defect) for the already processed lot.

Incidentally, when an interval for the substrate processing in units of lots is long, for example, the component degradation determination process may be implemented at any timing before or after the substrate processing in units of lots.

Figure 9:
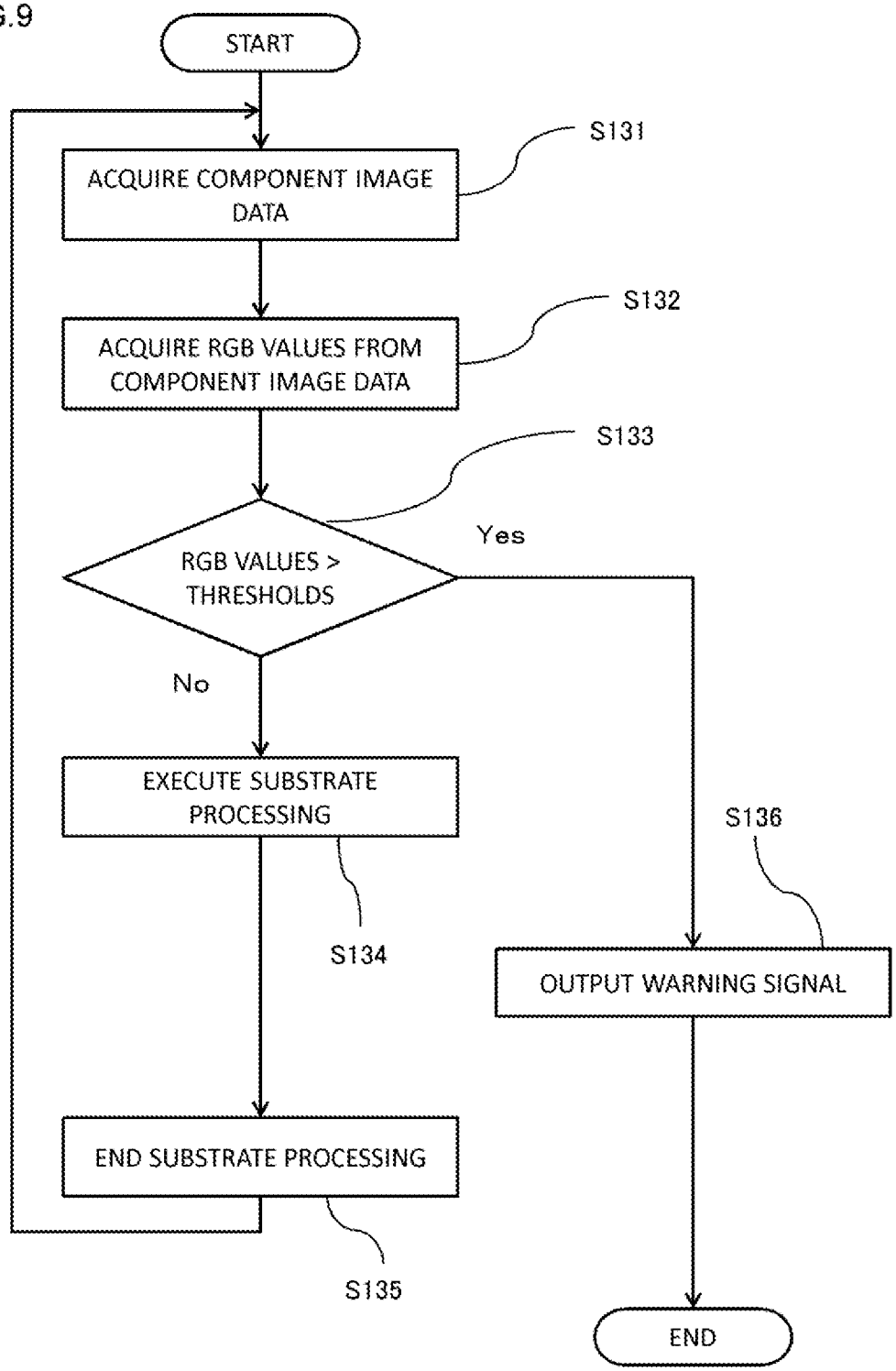
FIG. 9 is a flowchart illustrating an example of timing to implement processing for determining degradation of a component according to the first embodiment.

Further, the component degradation determination process may be implemented every time one substrate is processed as illustrated in FIG. 9. That is, an image of an inspection target component is captured by the camera 150 before starting the substrate processing in the substrate processing device 100 (Step S131). Then, RGB values of pixels indicating the inspection target component are extracted from captured image data by the signal processing unit 182 (Step S132). The determination unit 181 compares the extracted RGB values with the determination standard stored in the inspection standard storage unit 183 (Step S133), and the substrate processing is implemented when the extracted RGB values do not exceed the determination standard (Step S134). Then, when the processing for one substrate is completed, the process returns to Step S131 to repeat the processing (Step S135). On the other hand, when an input value exceeds the determination standard in Step S133, a warning signal to give a notification of degradation of the component is transmitted from the output unit 184 (Step S136).

With the configuration of the first embodiment as described above, the degradation of the components can be inspected during the idle time of the device in the substrate processing device using the conductive components so that a device operation ratio can be improved. Further, when degradation occurs in the components constituting the device, it is possible to quickly detect and respond to the degradation.

(Modifications)

Although the degradation determination thresholds are set based on the comparison between the initial RGB values and the degraded RGB values in the first embodiment described above, but it is not always necessary to do so. That is, if initial RGB values are obtained, values obtained by adding a predetermined margin to the initial RGB values can be used as the degradation determination thresholds. In this manner, it is not necessary to acquire image data of a component that has been degraded in advance, and it is possible to set a degradation determination standard without taking time and labor.

Further, the warning issuance standard is set so as to issue a warning when the pixels indicating values equal to or more than the degradation determination thresholds exceed the predetermined ratio out of the set of pixels indicating the inspection target component in the acquired image in the first embodiment, but a method for setting the warning issuance standard is not limited thereto. For example, the warning issuance standard may be set so as to issue a warning when the number of pixels indicating values equal to or more than the degradation determination standard is a predetermined number or more (including one) out of the set of pixels indicating the inspection target component in the acquired image. Further, an average value of the respective pixels constituting the set of pixels indicating the inspection target component in the acquired image may be calculated, and the warning issuance standard may be set so as to issue a warning when the average value is equal to or more than the degradation determination threshold.

Further, the component degradation determination is implemented at the timing when the substrate processing device 100 does not perform the cleaning process on the substrate W in the first embodiment, but the component degradation determination may be performed even during the substrate cleaning process. That is, the image of the cover member 123 and the upper surface processing solution nozzle 130 among the components to be inspected can be captured by the camera 150 even in the middle of the cleaning process of the substrate W. For this reason, the component degradation determination process may be implemented by capturing the image of the upper surface processing solution nozzle 130 with the camera 150, for example, while the upper surface processing solution nozzle 130 is arranged at the processing solution discharge position and the processing solution is discharged onto the substrate W.

Further, the camera 150 is arranged above the sidewall 111 of the chamber 110 in the first embodiment, but may be arranged in the upper surface processing solution nozzle 130 (for example, in the vicinity of the discharge head 131).

Further, the substrate processing device 100 has the single chamber 110 and processes the substrates W one by one in the first embodiment, but the present invention can also be applied to a large substrate processing device that includes a plurality of units of such substrate processing devices 100.

Second Embodiment

Figure 10:
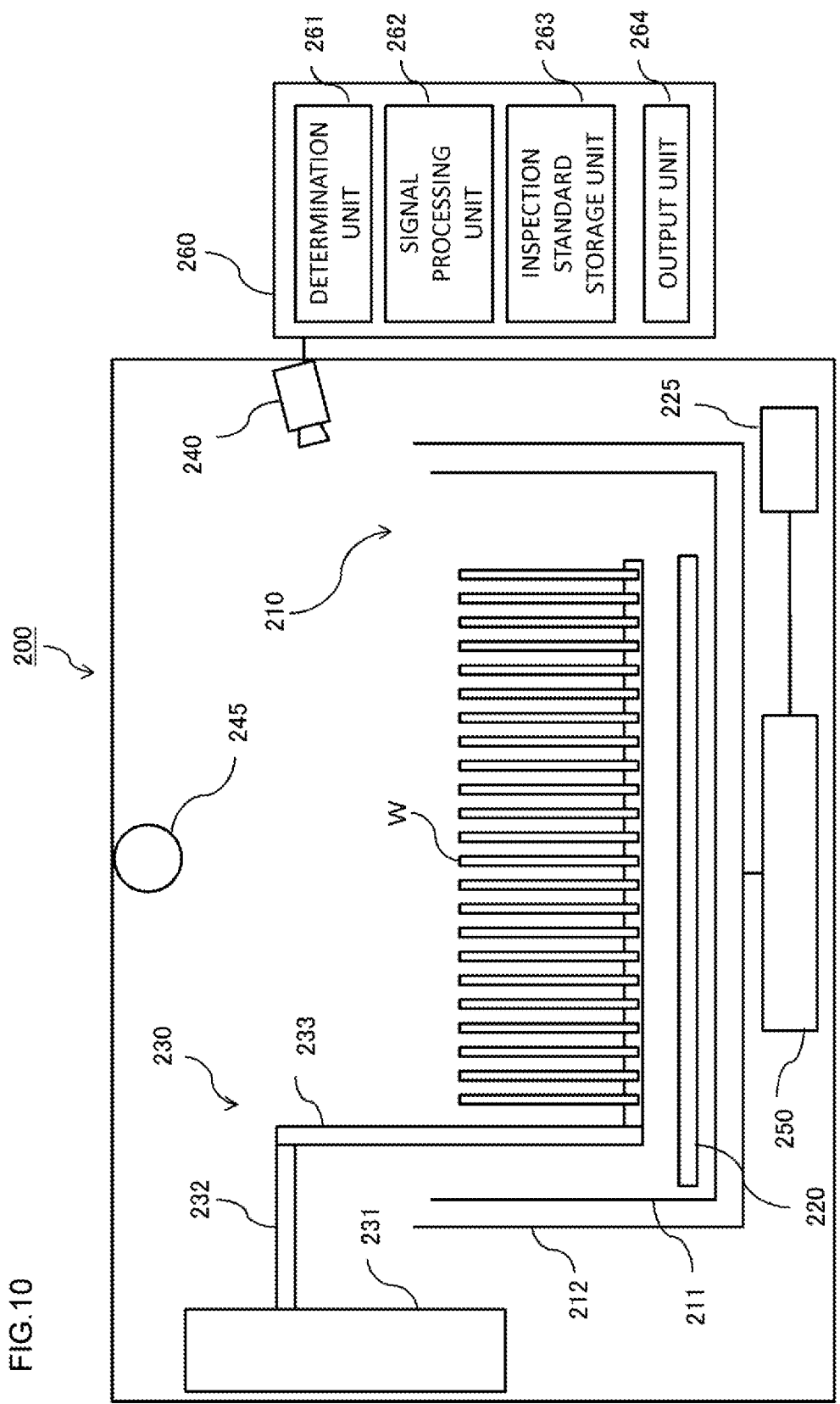
FIG. 10 is a schematic view illustrating a configuration of a substrate processing device according to a second embodiment.
Figure 11:
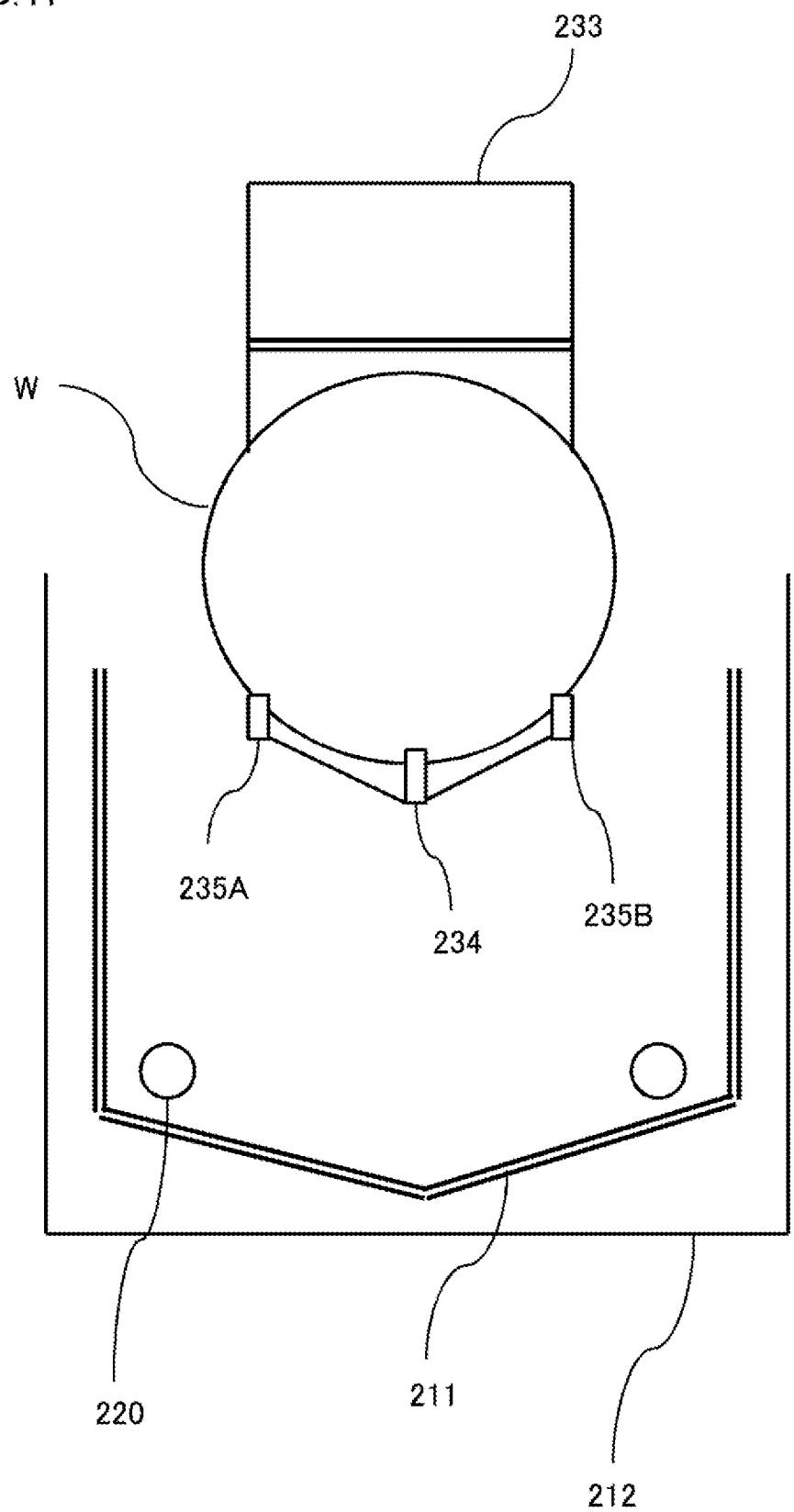
FIG. 11 is a schematic front view illustrating a configuration of the main part of a processing tank according to the second embodiment.

Next, a second embodiment of the present invention will be described. FIG. 10 is a schematic cross-sectional view illustrating a substrate processing device 200 of the present embodiment, and FIG. 11 is a schematic front view illustrating a configuration of the main part of a processing tank 210. The substrate processing device 200 is a so-called batch-type device that stores a processing solution in the processing tank 210 and immerses a substrate in the processing tank 210 using a lifter 230 that holds the substrate W to perform a cleaning process on the substrate W and the like. A plurality of the substrates W (hereinafter, a group of the plurality of substrates W is also referred to as a lot) are carried into and out of the substrate processing device 200 by a transfer robot (not illustrated). Incidentally, the substrate processing device 200 may be a multi-layer device using a different processing tank for each processing solution or may be a single-layer device capable of replacing a processing solution while holding the substrate W in the processing tank.

As illustrated in FIGS. 10 and 11, the substrate processing device 200 includes: the processing tank 210 including an immersion tank 211 and an overflow tank 212; processing solution discharge nozzles 220 arranged in the processing tank; a processing solution supply source 225; the lifter 230; a camera 240; an illumination device 245; a drainage processing unit 250; and a control device 260.

The processing solution discharge nozzles 220 are nozzles that are provided on both sides of the bottom of the immersion tank 211 and supply processing solutions such as various chemical solutions and pure water into the immersion tank 211. The processing solution discharge nozzle 220 is a cylindrical nozzle that extends along a direction in which the substrates W are arrayed in the lifter 230 of the processing tank 210, and includes a plurality of discharge holes. Further, the processing solution discharge nozzle 220 is connected to the processing solution supply source 225 outside the processing tank 210, and a predetermined processing solution is supplied from the processing solution supply source 225. Incidentally, the processing solution discharge nozzle 220 may be provided with one slit-shaped discharge port instead of the plurality of discharge holes.

Incidentally, as the chemical solution, for example, SPM (a mixed solution of sulfuric acid and hydrogen peroxide solution), ozone hydrogen peroxide (a mixed solution of ozone and hydrogen peroxide solution), SC1 (a mixed solution of an ammonia solution and hydrogen peroxide solution), SC2 (a mixed solution of hydrochloric acid and hydrogen peroxide solution), FPM (a mixed solution of hydrofluoric acid and hydrogen peroxide solution), FOM (a mixed solution of hydrofluoric acid and ozone hydrogen peroxide solution), HF (hydrofluoric acid), $H_3PO_4$ (phosphoric acid), or the like is used.

The processing solution supplied from the processing solution supply source 225 is discharged into the immersion tank 211 from the discharge hole of the processing solution discharge nozzle 220. Here, the discharge hole is provided toward the center bottom of the immersion tank 211, the processing solutions discharged from the processing solution discharge nozzles 220 on both sides flow parallel to a bottom wall of the immersion tank 211, eventually collide with each other at the bottom center of the immersion tank 211, and then, form a processing solution flow directed upward in the vicinity of the center of the immersion tank 211. Then, the processing solution supplied from the processing solution discharge nozzle 220 overflows from the upper part of the immersion tank 211, and the overflowed processing solution is collected in the drainage processing unit 250 communicating with the bottom of the overflow tank 212.

The lifter 230 is a mechanism for immersing the substrate W in the processing solution stored in the immersion tank 211. The lifter 230 includes: a lifting drive source 231; a lifter arm 232; a plate portion 233 connected to the lifter arm; and three substrate holding members (one central holding member 234 and two side holding members 235A and 235B) that are provided in cantilever shapes on the plate portion 233 and hold the substrate W. Among them, the central holding member 234 holds a substrate in contact with an outer edge of the substrate positioned vertically downward from the center of the substrate W held in a posture in which upper and lower surfaces are positioned in the horizontal direction (hereinafter also referred to as a standing posture). The side holding members 235A and 235B are arranged at equal distances from the central holding member 234 on both sides thereof with the central holding member 234 in the middle along the outer edge of the substrate W held in the standing posture. Then, an upper end of the central holding member 234 and lower ends of the side holding members 235A and 235B are arranged so as to have a predetermined interval in the vertical direction.

FIG. 12 is a schematic plan view of the plate portion 233 and the above three substrate holding members of the lifter 230. As illustrated in FIG. 12, each of the substrate holding members includes a comb-teeth portion K in which a plurality of grooves, which hold the substrate W at the standing position with the outer edge of the substrate W inserted therein, are arranged at predetermined intervals in the longitudinal direction.

Incidentally, the lifter arm 232, the plate portion 233, and the substrate holding members 234, 235A, and 235B can be integrally moved up and down in the vertical direction by the lifting drive source 231. As a result, the lifter 230 can move the plurality of substrates W, held in the state of being arrayed in parallel at predetermined intervals by the three substrate holding members, up and down between a position for immersion in the processing solution stored in the immersion tank 211 and a position for substrate delivery with the transfer robot above the processing tank 210. Incidentally, various known mechanisms such as a ball screw mechanism, a belt mechanism, and an air cylinder can be employed for the lifting drive source 231.

The camera 240 is arranged on a wall surface inside the substrate processing device 200 so as to be capable of capturing the image of the lifter 230 (particularly the vicinity of the plate portion 233). Further, the illumination device 245 is arranged above the device so as to be capable of illuminating the inside of the substrate processing device 200.

The camera 240 includes light receiving elements, for example, a CCD image sensor and the like, and light is converted into an electric charge according to the amount of received light in each light receiving element. Incidentally, the camera 240 includes three CCD image sensors for each of R, G, and B color components in the present embodiment, and the electric charge output from each light receiving element is input to the control device 260 as an output signal (captured data). Further, a general light source, for example, an LED, a fluorescent lamp, or the like can be used for the illumination device 245, but light to be emitted is desirably white light.

The drainage processing unit 250 collects the processing solution that has overflowed from the immersion tank 211 to the overflow tank 212 as described above. A drainage solution collected in the drainage processing unit 250 is purified, and then, sent to the processing solution supply source 225 for recycling. Alternatively, the drainage solution may be discharged out of the device without performing the purification.

A configuration of the control device 260 as hardware is the same as that of a general computer. That is, an input unit such as a keyboard, an output unit such as a monitor, a CPU, a ROM, a RAM, a mass storage device, and the like are provided. When the CPU of the control device 260 executes a predetermined processing program, each operation mechanism such as the transfer robot, the processing solution discharge nozzle 220, and the lifter 230 of the substrate processing device 200 is controlled to perform processing in the substrate processing device 200.

Incidentally, the control device 260 includes a determination unit 261, a signal processing unit 262, an inspection standard storage unit 263, and an output unit 264 that perform functions relating to a component inspection, but these functions are the same as those in the first embodiment, and thus, detailed descriptions thereof will be omitted.

Among the components constituting the substrate processing device 200 described above, those in contact with at least the processing solution (and vapor of the processing solution), for example, each portion of the lifter 230, the immersion tank 211, and the like, are coated with a resin in order to suppress erosion caused by the chemical solution, and have a coating layer on the surface. Examples of the resin used for the coating include PCTFE (polychlorotrifluoroethylene), ECTFE (a chlorotrifluoroethylene/ethylene copolymer), PFA (a tetrafluoroethylene/perfluoroalkyl vinyl ether copolymer), PTFE (polytetrafluoroethylene), and the like.

(Regarding Degradation Determination Processing Method)

Next, a component degradation determination process performed by the determination unit 261 of the control device 260 will be described. The determination unit 261 performs an inspection based on an image captured by the camera 240 as to whether an inspection target component has been degraded. More specifically, degradation determination is performed based on color information of RGB color components obtained from image data of the target component. Incidentally, in the present embodiment, the inspection target component is the lifter 230 (the plate portion 233 and the respective substrate holding members).

Although the lifter 230 has been coated with the resin as described above, the coating is gradually degraded due to the chemical solution, and a phenomenon (blister) in which a surface of the resin coating layer floats up like a blister occurs. Further, a metal part (primer) used as a base of the coating appears in a part where the resin coating has been peeled off. That is, it is possible to grasp degradation of the component coated with the resin as an exterior change, and the change can be detected by capturing the image of the component with the camera and acquiring color information from image data.

Incidentally, such an exterior change progresses along with the degradation of the component, and thus, it is possible to prevent continuous use of an abnormal component if a warning is issued before degradation of the component becomes an unallowable degree, that is, while the exterior change of the components is being relatively small. For this reason, a standard (warning issuance standard) for determination on whether to issue the warning is set, an image of a target component is captured by the camera 240 to acquire color information (RGB values) from image data, and a warning is issued from the output unit 264 if the obtained color information deviates from the standard. Incidentally, the warning issued from the output unit 264 may be an error screen displayed on a monitor, an alarm issued from a speaker, flickering of an alarm lamp, or the like.

Such a determination standard is set as follows, for example. That is, when a new device is started up or when a component is replaced with a new component, an image of an inspection target component is captured by the camera 240, and R, G, and B values (initial RGB values) processed by the signal processing unit 262 are saved in the inspection standard storage unit 263 together with image data (initial image data) of the component.

Next, values obtained by adding (or subtracting) a predetermined margin to (from) the initial RGB values are registered in the inspection standard storage unit 263 as degradation determination thresholds. Incidentally, the exterior change does not occur uniformly over the entire component, and thus, it is necessary to define a relationship between the degradation determination threshold and a warning issuance standard. That is, it is defined the number of pixels reaching the degradation determination thresholds or more among a set of pixels indicating an inspection target component in an image acquired by the camera 240 for which a warning is to be issued. In the present embodiment, the warning issuance standard is set so as to issue a warning when the number of pixels indicating values equal to or more than the degradation determination thresholds exceeds a predetermined number out of a set of pixels indicating an inspection target component in an acquired image.

(Inspection Implementation Timing)

Subsequently, the timing to implement component degradation determination (that is, an inspection) will be described. An outline of a normal operation of the substrate W in the substrate processing device 200 includes placement of a lot of unprocessed substrates W received from the outside by the transfer robot onto the lifter 230, immersion of the lot in the immersion tank 211 in which the processing solution is stored for a predetermined time, and then, reception and carrying-out of the processed lot and returning of the lot to the outside by the transfer robot.

Based on the above description, it is difficult to properly capture the image of the lifter 230 serving as the inspection target component during the processing of the substrate W. For this reason, the component degradation determination is implemented at timing when the substrate processing device 200 is not performing the cleaning process on the substrate W in the present embodiment.

For example, the component degradation determination process is preferably implemented before starting the substrate processing for each lot. That is, an image of an inspection target component is captured by the camera 240 during the idle time before starting the substrate processing for each lot in the substrate processing device 200. Then, RGB values of pixels indicating the inspection target component are extracted from captured image data by the signal processing unit 262. Then, the determination unit 261 compares the determination standard stored in the inspection standard storage unit 263 with the extracted RGB values, and substrate processing for one lot is implemented when the extracted RGB values do not exceed the determination standard. On the other hand, when the extracted RGB values exceed the determination standard, a warning signal to give an notification of degradation of the component is transmitted from the output unit 264.

Further, the component degradation determination process may be implemented after completing the substrate processing for each lot. That is, an image of an inspection target component is captured by the camera 240 after the substrate processing for one lot is completed in the substrate processing device 200. Then, RGB values of pixels indicating the inspection target component are extracted from captured image data by the signal processing unit 262. Then, the determination unit 261 compares the determination standard stored in the inspection standard storage unit 263 with the extracted RGB values, and this flow ends when the extracted RGB values do not exceed the determination standard. On the other hand, when the extracted RGB values exceed the determination standard, a warning signal to give a notification of degradation of the component is transmitted from the output unit 264.

Incidentally, if an interval for the substrate processing in units of lots seems to be long, for example, the component degradation determination process may be implemented at any timing before or after the substrate processing in units of lots.

With the configuration of the second embodiment as described above, the degradation of the components can be inspected using the image during the idle time of the device in the substrate processing device including the components coated with the resin so that a device operation ratio can be improved. Further, when degradation occurs in the components constituting the device, it is possible to quickly detect and respond to the degradation.

Others

Incidentally, the above respective embodiments have been given only to describe the present invention illustratively, and the present invention is not limited to the above specific modes. The present invention can be variously modified within the scope of the technical idea. For example, the techniques of the first embodiment and the second embodiment described above can be used in combination or interchanged with each other. Specifically, a device capable of inspecting both a component made of a conductive material and a component coated with a resin may be used in a sheet-type substrate processing device. Further, regarding the setting of the degradation determination threshold in the batch-type device, a data table in accordance with a difference in chemical solutions to be used, a difference in resins to be used for coating, and the like may be created.

Further, the single camera is arranged in the device in each of the above embodiments, but images of different components may be captured using a plurality of cameras, and images of one component may be captured from different angles.

Further, the color information used for the component degradation determination is obtained based on the RGB color space in each of the above embodiments, but the component degradation determination may be performed using color information of another scheme. For example, the degradation determination may be performed using color coordinates such as an HSV color space and an HLS space. In this case, an RGB color image obtained by combining RGB signals is converted into another format, and a value of each converted pixel is extracted. Incidentally, existing well-known techniques can be widely employed as a method for converting RGB color into another color model.

REFERENCE SIGNS LIST

100, 200 substrate inspection device
110 chamber
120 spin chuck
130 upper surface processing solution nozzle
140 cup
150, 240 camera
160, 245 illumination device
180 control device
210 processing tank
220 processing solution discharge nozzle
230 lifter
250 drainage processing unit
W substrate
K comb-teeth portion

The invention claimed is:

1. A substrate processing device that performs substrate processing with a processing solution, the substrate processing device comprising an inspection unit that inspects degradation of components constituting the substrate processing device, the components including at least one inspection target component,
   the at least one inspection target component is made of a conductive material containing carbon or has a resin coating layer formed on a surface,
   wherein the inspection unit includes:
   a capturing unit that acquires image data that includes the at least one inspection target component;
   a color information acquisition unit that acquires color information of the at least one inspection target component from the image data acquired by the capturing unit; and
   a degradation determination unit that determines a degree of discoloration due to degradation of the at least one inspection target component that is degraded by contact with the processing solution, based on the acquired color information, wherein the conductive material contains at least any of a tetrafluoroethylene/ethylene copolymer, a carbon fiber-containing tetrafluoroethylene/perfluoroalkyl vinyl ether copolymer, carbon nanotube-containing polychlorotrifluoroethylene, and carbon nanotube-containing polytetrafluoroethylene.

2. The substrate processing device according to claim 1, wherein the color information acquired by the color information acquisition unit includes an RGB component value.

3. The substrate processing device according to claim 2, wherein the degradation determination unit determines the degradation degree based on a comparison between the RGB component value and a predetermined threshold.

4. The substrate processing device according to claim 1, further comprising an output unit that outputs the degradation degree determined by the degradation determination unit,
   wherein the output unit outputs a warning signal when the degradation degree determined by the degradation determination unit exceeds a predetermined standard.

5. The substrate processing device according to claim 1, wherein the at least one inspection target component includes any of a spin base, a chuck pin, a spin chuck, a lifter, and a nozzle.

6. The substrate processing device according to claim 1, wherein the processing solution contains any of sulfuric acid hydrogen peroxide, ozone hydrogen peroxide, hydrofluoric acid hydrogen peroxide, ammonia hydrogen peroxide, hydrochloric acid hydrogen peroxide, hydrofluoric acid ozone hydrogen peroxide, hydrofluoric acid, and phosphoric acid.

7. A substrate processing device that performs substrate processing with a processing solution, the substrate processing device comprising an inspection unit that inspects degradation of components constituting the substrate processing device, the components including at least one inspection target component,
the at least one inspection target component is made of a conductive material containing carbon or has a resin coating layer formed on a surface,
wherein the inspection unit includes:
a capturing unit that acquires image data that includes the at least one inspection target component
a color information acquisition unit that acquires color information of the at least one inspection target component from the image data acquired by the capturing unit and
a degradation determination unit that determines a degree of discoloration due to degradation of the at least one inspection target component that is degraded by contact with the processing solution, based on the acquired color information, wherein the resin coating layer is in contact with the processing solution during substrate processing.

8. A substrate processing device that performs substrate processing with a processing solution, the substrate processing device comprising an inspection unit that inspects degradation of components constituting the substrate processing device, the components including at least one inspection target component,
the at least one inspection target component is made of a conductive material containing carbon or has a resin coating layer formed on a surface,
wherein the inspection unit includes:
a capturing unit that acquires image data that includes the at least one inspection target component
a color information acquisition unit that acquires color information of the at least one inspection target component from the image data acquired by the capturing unit and
a degradation determination unit that determines a degree of discoloration due to degradation of the at least one inspection target component that is degraded by contact with the processing solution, based on the acquired color information, wherein the capturing unit is arranged inside the device, and wherein the capturing unit is arranged in a nozzle that discharges the processing solution.

9. A component inspection method for inspecting a component of a substrate processing device that performs substrate processing with a processing solution, the components including at least one inspection target component made of a conductive material containing carbon or has a resin coating layer formed on a surface, and the component inspection method for the substrate processing device comprising:
a capturing step of capturing an image data that includes the at least one inspection target component;
a color information acquisition step of acquiring color information of the at least one inspection target component from image data captured in the capturing step; and
a degradation determination step of determining a degree of discoloration due to degradation of the at least one inspection target component that is degraded by contact with the processing solution, based on the color information acquired in the color information acquisition step, wherein the at least one inspection target component contains at least any of a tetrafluoroethylene/ethylene copolymer, a carbon fiber-containing tetrafluoroethylene/perfluoroalkyl vinyl ether copolymer, carbon nanotube-containing polychlorotrifluoroethylene, and carbon nanotube-containing polytetrafluoroethylene.

10. The component inspection method for a substrate processing device according to claim 9, wherein the color information acquired in the color information acquisition step includes an RGB component value.

11. The component inspection method for a substrate processing device according to claim 10, wherein in the degradation determination step, the degradation degree is determined based on a comparison between the RGB component value and a predetermined threshold.

12. The component inspection method for a substrate processing device according to claim 9, further comprising a warning step of outputting a warning signal when the degradation degree determined in the degradation determination step exceeds a predetermined standard.

13. The component inspection method for a substrate processing device according to claim 9, wherein the at least one inspection target component include any of a spin base, a chuck pin, a spin chuck, a nozzle, and a lifter.

14. The component inspection method for a substrate processing device according to claim 9, wherein the processing solution contains any of sulfuric acid hydrogen peroxide, ozone hydrogen peroxide, hydrofluoric acid hydrogen peroxide, ammonia hydrogen peroxide, hydrochloric acid hydrogen peroxide, hydrofluoric acid ozone hydrogen peroxide, hydrofluoric acid, and phosphoric acid.

* * * * *